United States Patent
Roy

(10) Patent No.: US 10,475,827 B2
(45) Date of Patent: Nov. 12, 2019

(54) ELECTRONIC IMAGE CAPTURE DEVICE

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 16/035,193

(22) Filed: Jul. 13, 2018

(65) Prior Publication Data
US 2019/0027523 A1    Jan. 24, 2019

(30) Foreign Application Priority Data
Jul. 19, 2017  (FR) ...................... 17 56836

(51) Int. Cl.
*H01L 27/146*    (2006.01)

(52) U.S. Cl.
CPC .... *H01L 27/14603* (2013.01); *H01L 27/1469* (2013.01); *H01L 27/14634* (2013.01); *H01L 27/14636* (2013.01); *H01L 27/14687* (2013.01)

(58) Field of Classification Search
CPC ......... H01L 27/14634; H01L 27/14636; H01L 27/14603; H01L 27/14632
See application file for complete search history.

(56) References Cited

U.S. PATENT DOCUMENTS

| 2011/0049336 | A1 | 3/2011 | Matsunuma |
| 2013/0277789 | A1* | 10/2013 | Chen ................ H01L 27/14687 257/460 |
| 2017/0033144 | A1 | 2/2017 | Takahashi |

FOREIGN PATENT DOCUMENTS

WO    2012004965 A1    1/2012

OTHER PUBLICATIONS

INPI Search Report and Written Opinion for FR 1756836 dated Mar. 27, 2018 (8 pages).

* cited by examiner

*Primary Examiner* — Grant S Withers
(74) *Attorney, Agent, or Firm* — Crowe & Dunlevy

(57) ABSTRACT

An electronic image capture device includes a first portion and a second portion. The first portion is formed by a substrate wafer provided on one side with electronic circuits and a dielectric layer with a network of electrical connections and external electrical contacts on an outer surface. The second portion includes a pixel wafer capable of generating electrical signals under the effect of light, a substrate wafer mounted to the pixel wafer and provided with electronic circuits and a dielectric layer with a network of electrical connections and external electrical contacts on an outer surface. The outer surfaces and external electrical contacts are bonded to each other so as to mount the first portion to the second portion. A connection pad extends through a hole in the pixel wafer to make electrical connection to the network of electrical connections of the second portion.

19 Claims, 1 Drawing Sheet

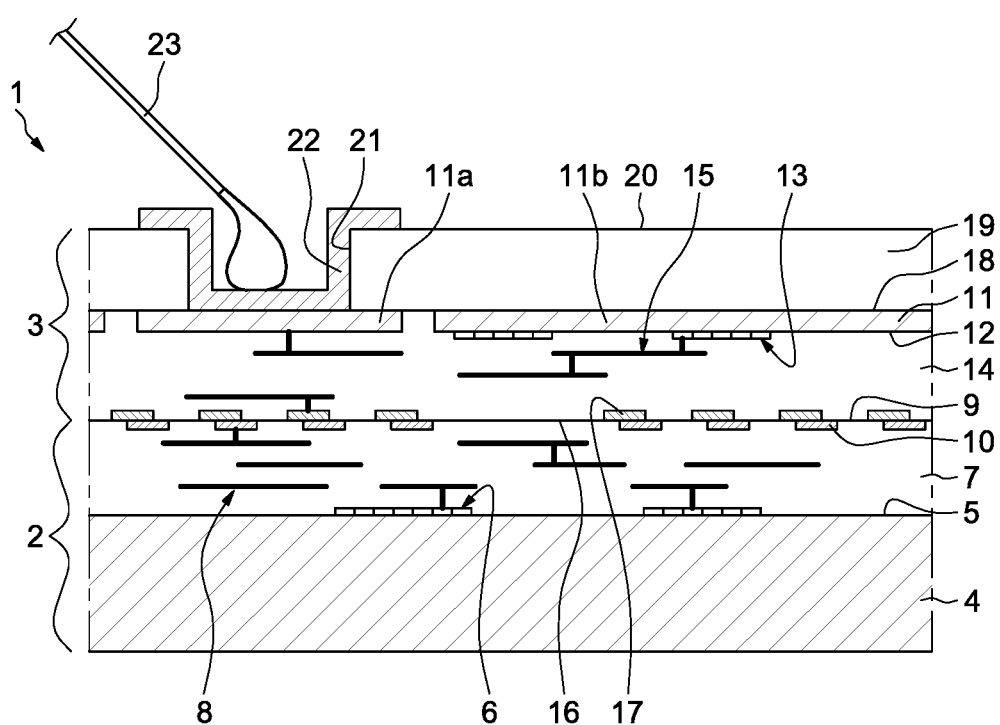

ELECTRONIC IMAGE CAPTURE DEVICE

PRIORITY CLAIM

This application claims the priority benefit of French Application for Patent No. 1756836 filed on Jul. 19, 2017, the content of which is hereby incorporated by reference in its entirety to the maximum extent allowable by law.

TECHNICAL FIELD

Embodiments of the present invention relate to the field of electronic devices that are capable of capturing images.

SUMMARY

In an embodiment, an electronic image capture device comprises a first portion and a second portion. The first portion includes a semiconductor substrate wafer provided on one side with integrated electronic circuits and with a dielectric layer including a network of electrical connections, this dielectric layer having a face provided with electrical contacts. The second portion is configured to generate electrical signals under the effect of light, in the form of pixels, and includes a semiconductor substrate wafer provided on one side with integrated electronic circuits and with a dielectric layer including a network of electrical connections, this dielectric layer having a face provided with electrical contacts, and provided, on the other side, with a secondary wafer defining said pixels.

Said first portion and said second portion are mounted on top of one another in a position such that their aforementioned faces provided with electrical contacts are bonded together and these electrical contacts are respectively bonded together.

Pads for external electrical connection are made in holes in said secondary wafer and are linked to said network of electrical connections of said second portion.

Said first portion and said second portion may be assembled together by means of molecular adhesion of said faces and of said electrical contacts.

The substrate wafer and the secondary wafer may be assembled together by means of molecular adhesion of one to the other.

Said holes may be located in regions of said second portion that are free from electronic circuits and pixels.

The substrate wafer of the second portion may comprise insulated sections that have been made electrically conductive, which have one side connected to said network of electrical connections of said second portion and another side on which said pads for external electrical connection are made in said holes.

Said insulated sections of the substrate wafer of said second portion may be free from electronic circuits.

Said insulated sections may be made conductive by depositing and diffusing a metal into the semiconductor material.

BRIEF DESCRIPTION OF THE DRAWING

An electronic image capture device will now be described by way of non-limiting example, illustrated by:

FIG. 1 which shows cross-sectional view of the electronic image capture device.

DETAILED DESCRIPTION

FIG. 1 illustrates an electronic image capture device 1, which device comprises a first portion 2 and a second portion 3, which are bonded together.

The first portion 2 comprises a semiconductor substrate wafer 4, made of silicon, provided on one side 5 with integrated electronic circuits 6 and with a dielectric layer 7 including a network of electrical connections 8.

The dielectric layer 7 has a front face 9 opposite the substrate wafer 4 that is provided with electrical contacts 10.

The network of electrical connections 8 comprises multiple metal levels that are selectively connected to one another, to the electronic circuits 6 and to the electrical contacts 10.

The integrated electronic circuits 6 comprise, in particular, control circuits for the electronic image capture device 1.

The second portion 3 is capable of generating signals under the effect of light and comprises a thin semiconductor substrate wafer 11, made of silicon, provided on one side 12 with integrated electronic circuits 13 and with a dielectric layer 14 including a network of electrical connections 15.

The dielectric layer 14 has a front face 16 opposite the substrate wafer 11 that is provided with electrical contacts 17.

The second portion 3 further comprises, on the other side 18 of the thin semiconductor substrate wafer 11, a secondary wafer 19 (membrane) that is capable of absorbing light and defining the photosensitive zone of the pixels (this wafer 19 being made for example of silicon and insulated from the semiconductor substrate wafer 11).

The network of electrical connections 15 comprises multiple metal levels that are selectively linked to one another, to the electronic circuits 13, to the electrical contacts 17 and to portions of the secondary layer 19, using through passages (not explicitly shown in FIG. 1) through the substrate wafer 11 to the photosensitive zones in the layer 19.

The electronic circuits 13 comprise, in particular, transistors and charge storage capacitors associated with pixel read out circuitry for the electronic image capture device 1. The photosensitive zone may comprise, for example, a photodiode or other light sensitive integrated circuitry or regions known in the art formed in the secondary layer 19.

Detecting the light reaching the outer face 20 of the wafer 19 (back face of the second portion 3), opposite the substrate wafer 11, the electronic circuits 13 and the secondary wafer 19, defining MOS capacitors, deliver signals in the form of pixels thereto.

The first portion 2 and the second portion 3 are mounted or stacked on top of one another in a position such that their faces 9 and 16 are bonded together by means of molecular adhesion and such that the electrical contacts 10 and 17 are selectively bonded together by means of adhesion.

The second portion 3 has blind holes 21 in which pads for external electrical connection 22 are made, which pads are selectively linked to the network of electrical connections 15.

The holes 21 are made in the secondary wafer 19, from the outer face 20 (back face), in places free from electronic circuits 13, and reach insulated sections 11a of the substrate wafer 11.

The sections 11a of the substrate wafer 11 are separated from the rest 11b of this wafer on which electronic circuits 13 are made by insulating regions such as trench insulations.

The sections 11a are made electrically conductive beforehand, for example by depositing a metal such as cobalt on the sections 11a and diffusing the metal into the silicon by means of heat treatment so as to form a metal silicide.

On one side the sections 11*a* are connected to the network of electrical connections 15 and on the other side the electrical connection pads 22 are made on the sections 11*a*, in the holes 21.

The electrical connection pads 22 may be made of aluminum or of copper, with conductive adhesion layers interposed between them and the sections 11*a* and insulating layers interposed between them and the secondary wafer 19.

The result of the foregoing is that the networks of electrical connections 8 and 15 are selectively linked to one another via the electrical contacts 10 and 17, linked to the electronic circuits 6 and 13 and linked to the pads for external electrical connection 22, so as to supply power to the electronic circuits 6 and 13 from the outside and to provide signal exchanges between the electronic circuits 6 and 13 and between each of the electronic circuits 6 and 13 and the outside.

The electronic device 1 may be fabricated in the following way.

The first portion 2 and the second portion 3 are fabricated separately.

The second portion 3 may be fabricated in the following way. A first element comprising the secondary wafer 19, comprising the photosensitive zones of the pixels, is fabricated sequentially. A substrate 11 is next bonded by means of molecular adhesion to the thick secondary wafer 19, these elements comprising, for example, layers of silicon oxide to this end.

After this bonding has been achieved, the sections 11*a* of wafer 11 are defined and made electrically conductive through a silicide process, the electronic circuits 13 are defined in the sections 11*b* of the wafer 11, and the dielectric layer 14 is formed and provided with the network of electrical connections 15. Next, the portions 2 and 3 are mounted on top of one another by means of molecular adhesion as described above.

After this sequence, the secondary wafer 19 is thinned on the side opposite the molecular bonding in order to obtain a photosensitive membrane having, after thinning, an outer face 20. Next, the holes 21 are made and the electrical connection pads 22 are fabricated.

Next, the electronic device 1 may be linked to an external electronic device by connecting electrical wires 23 to the electrical connection pads 22.

According to another arrangement, the electrical connection pads 22 could protrude, so as to be connected to an external electronic device via fused contacts.

The invention claimed is:

1. An electronic image capture device, comprising:
   a first portion comprising:
      a first semiconductor substrate wafer including a first surface provided with integrated electronic circuits; and
      a first dielectric layer mounted at the first surface of the first semiconductor substrate wafer and including a network of electrical connections, wherein an outer surface of the first dielectric layer includes first electrical contacts; and
   a second portion comprising:
      a membrane layer including pixels configured to generate electrical signals in response to light;
      a second semiconductor substrate wafer including a first surface provided with integrated electronic circuits, a second surface of the second semiconductor substrate wafer mounted directly to the membrane layer; and
      a second dielectric layer mounted at the first surface of the second semiconductor substrate wafer and including a network of electrical connections, wherein an outer surface of the second dielectric layer includes second electrical contacts;
   wherein said first portion is mounted to said second portion in a position such that the outer surface of the first dielectric layer and the outer surface of the second dielectric layer provided with first and second electrical contacts, and the first electrical contacts are directly bonded to the second electrical contacts; and
   wherein a pad for external electrical connection extends through a hole in the membrane layer, said pad being electrically linked to said network of electrical connections included within the second dielectric layer of said second portion.

2. The device according to claim 1, wherein said first portion and said second portion are assembled together by means of molecular adhesion of said outer surface of the first dielectric layer and the outer surface of the second dielectric layer and of said first and second electrical contacts.

3. The device according to claim 1, wherein the second semiconductor substrate wafer and the membrane layer are assembled together by means of molecular adhesion.

4. The device according to claim 1, wherein said hole is located in a region of said second portion that is free from electronic circuits and pixels.

5. The device according to claim 1, wherein the second semiconductor substrate wafer comprises: a first second and a second section, wherein the first and second sections are insulated from each other, wherein the first section provides an electrical connection between the pad and the network of electrical connections included within the second dielectric layer; and wherein the integrated electronic circuits are located with the second section.

6. The device according to claim 5, wherein the first section does not include any integrated electronic circuits.

7. The device according to claim 5, further including a trench isolation for insulating the first and second sections from each other.

8. An electronic image capture device, comprising:
   a first portion comprising:
      a first semiconductor substrate wafer including a first surface provided with integrated electronic circuits; and
      a first dielectric layer mounted at the first surface of the first semiconductor substrate wafer and including a network of electrical connections, wherein an outer surface of the first dielectric layer includes first electrical contacts; and
   a second portion comprising:
      a membrane layer including pixels configured to generate electrical signals in response to light;
      a second semiconductor substrate wafer including a first surface provided with integrated electronic circuits, a second surface of the second semiconductor substrate wafer mounted to the membrane layer; and
      a second dielectric layer mounted at the first surface of the second semiconductor substrate wafer and including a network of electrical connections, wherein an outer surface of the second dielectric layer includes second electrical contacts;
   wherein said first portion is mounted to said second portion in a position such that the outer surface of the first dielectric layer and the outer surface of the second dielectric layer provided with first and second electrical contacts, and the first electrical contacts are bonded to the second electrical contacts;

wherein a pad for external electrical connection extends through a hole in the membrane layer, said pad being electrically linked to said network of electrical connections included within the second dielectric layer of said second portion;

wherein the second semiconductor substrate wafer comprises: a first second and a second section, wherein the first and second sections are insulated from each other, wherein the first section provides an electrical connection between the pad and the network of electrical connections included within the second dielectric layer; and wherein the integrated electronic circuits are located with the second section; and wherein the first section is electrically conductive and is aligned with a location of said hole and the pad.

9. The device according to claim 8, wherein the first section does not include any integrated electronic circuits.

10. The device according to claim 8, further including a trench isolation for insulating the first and second sections from each other.

11. The device according to claim 8, wherein said first portion and said second portion are assembled together by means of molecular adhesion of said outer surface of the first dielectric layer and the outer surface of the second dielectric layer surfaces and of said first and second electrical contacts.

12. The device according to claim 8, wherein the second semiconductor substrate wafer and the membrane layer are assembled together by means of molecular adhesion.

13. The device according to claim 8, wherein said hole is located in a region of said second portion that is free from electronic circuits and pixels.

14. An electronic image capture device, comprising:
a first portion comprising:
  a first semiconductor substrate wafer including a first surface provided with integrated electronic circuits; and
  a first dielectric layer mounted at the first surface of the first semiconductor substrate wafer and including a network of electrical connections, wherein an outer surface of the first dielectric layer includes first electrical contacts; and
a second portion comprising:
  a membrane layer including pixels configured to generate electrical signals in response to light;
  a second semiconductor substrate wafer including a first surface provided with integrated electronic circuits, a second surface of the second semiconductor substrate wafer mounted to the membrane layer; and
  a second dielectric layer mounted at the first surface of the second semiconductor substrate wafer and including a network of electrical connections, wherein an outer surface of the second dielectric layer includes second electrical contacts;

wherein said first portion is mounted to said second portion in a position such that the outer surface of the first dielectric layer and the outer surface of the second dielectric layer provided with first and second electrical contacts, and the first electrical contacts are bonded to the second electrical contacts;

wherein a pad for external electrical connection extends through a hole in the membrane layer, said pad being electrically linked to said network of electrical connections included within the second dielectric layer of said second portion;

wherein the second semiconductor substrate wafer comprises: a first second and a second section, wherein the first and second sections are insulated from each other, wherein the first section provides an electrical connection between the pad and the network of electrical connections included within the second dielectric layer; and wherein the integrated electronic circuits are located with the second section; and wherein the first section includes at least a portion that comprises a metal silicide formed from the second semiconductor substrate wafer.

15. The device according to claim 14, wherein the first section does not include any integrated electronic circuits.

16. The device according to claim 14, further including a trench isolation for insulating the first and second sections from each other.

17. The device according to claim 14, wherein said first portion and said second portion are assembled together by means of molecular adhesion of said outer surface of the first dielectric layer and the outer surface of the second dielectric layer surfaces and of said first and second electrical contacts.

18. The device according to claim 14, wherein the second semiconductor substrate wafer and the membrane layer are assembled together by means of molecular adhesion.

19. The device according to claim 14, wherein said hole is located in a region of said second portion that is free from electronic circuits and pixels.

* * * * *